United States Patent
Lin et al.

(10) Patent No.: US 7,767,369 B2
(45) Date of Patent: Aug. 3, 2010

(54) PHOTO-MASK AND THIN-FILM TRANSISTOR SUBSTRATE

(75) Inventors: Hsueh-Hui Lin, Hsin-Chu (TW); Chu-Hung Tsai, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 353 days.

(21) Appl. No.: 12/071,427

(22) Filed: Feb. 21, 2008

(65) Prior Publication Data

US 2009/0136856 A1    May 28, 2009

(30) Foreign Application Priority Data

Nov. 28, 2007   (TW) .............................. 96145135 A

(51) Int. Cl.
*G03F 1/00*    (2006.01)
(52) U.S. Cl. .......................... 430/5; 430/311; 430/312; 430/313
(58) Field of Classification Search ................ 430/5, 430/22, 30, 311–314, 322, 394; 438/149–152; 349/139, 187
See application file for complete search history.

(56) References Cited

U.S. PATENT DOCUMENTS 6,917,053 B2 * 7/2005 Kuo et al. .................... 257/72
7,279,257 B2 * 10/2007 Takizawa .................... 430/22
7,670,883 B2 * 3/2010 Shih et al. ................... 438/149
2007/0026586 A1 * 2/2007 Kim et al. ................... 438/152
2007/0031764 A1 * 2/2007 Liou et al. ................... 430/322
2007/0134567 A1 * 6/2007 Park et al. .................... 430/5
2008/0024415 A1 * 1/2008 Jung et al. .................... 345/92

FOREIGN PATENT DOCUMENTS

CN       1904725 A       1/2007

* cited by examiner

*Primary Examiner*—Mark F Huff
*Assistant Examiner*—Stewart A Fraser
(74) *Attorney, Agent, or Firm*—Bacon & Thomas, PLLC

(57) ABSTRACT

A photo-mask having a first exposure area, a second exposure area and a third exposure area is for manufacturing a thin-film transistor substrate. The photo-mask includes a first peripheral line pattern, a first dummy line pattern, a first overlapping pixel pattern and a second overlapping pixel pattern. The first peripheral line pattern is in the first exposure area. The first dummy line pattern is in the first exposure area and connected to the first peripheral line pattern. The first overlapping pixel pattern is in the first exposure area and connected to the first dummy line pattern. The first overlapping pixel pattern is complementary to the second overlapping pixel pattern in the second exposure area. After exposing through and overlapping the first and second overlapping pixel patterns, two patterns respectively formed from exposing through the first and second exposure area are unified.

12 Claims, 13 Drawing Sheets

PHOTO-MASK AND THIN-FILM TRANSISTOR SUBSTRATE

This application claims the benefit of Taiwan patent application Serial No. 96145135, filed Nov. 28, 2007, the subject matter of which is incorporated herein by reference.

BACKGROUND OF THE INVENTION

1. Field of the Invention

The invention relates in general to a method of manufacturing a photo-mask and a thin-film transistor substrate, and more particularly to a method of manufacturing a photo-mask applied to a large-size thin-film transistor substrate and a large-size thin-film transistor substrate.

2. Description of the Related Art

As the trend is toward larger size liquid crystal display panels, the manufacturing process of thin-film transistor substrates becomes more difficult accordingly. Generally speaking, a thin-film transistor substrate is manufactured by several lithography and etching processes. The pattern of a photo-mask is transformed to a photoresist layer of the substrate through several exposure processes for forming a patterned photoresist layer. Then, the patterned photoresist layer is used as a mask to etch the thin film on the substrate for forming the pattern of all kinds of devices.

As the size of the thin film transistor substrate increases, the photo-mask becomes larger as well. However, it is difficult to manufacture large-size photo-masks. Also, the manufacturing cost thereof increases dramatically as the size of the photo-mask increases. Therefore, it is very important to manufacture a photo-mask and a thin-film transistor substrate which meet the requirement of the manufacturing process of the large size thin-film transistor substrate.

SUMMARY OF THE INVENTION

The invention is directed to a method of manufacturing a photo-mask and a thin-film transistor substrate. A dummy line pattern and an overlapping pixel pattern are used for meeting the requirement of the manufacturing process of a large-size thin-film transistor substrate.

One aspect of the present invention is directed to a photo-mask. The photo-mask is for manufacturing a thin-film transistor substrate. The photo-mask has a first exposure area, a second exposure area and a third exposure area. The second exposure area is located between the first exposure area and the third exposure area. The photo-mask includes a first peripheral line pattern, a first dummy line pattern, a first overlapping pixel pattern and a second overlapping pixel pattern. The first peripheral line pattern is located in the first exposure area. The first dummy line pattern is located in the first exposure area and connected to the first peripheral line pattern. The first overlapping pixel pattern is located in the first exposure area and connected to the first dummy line pattern. The second overlapping pixel pattern is located in the second exposure area and complementary to the first overlapping pixel pattern. After exposing through and overlapping the first overlapping pixel pattern and the second overlapping pixel pattern, two patterns respectively formed from exposing through the first exposure area and the second exposure area are unified.

Another aspect of the present invention is directed to a method of manufacturing a thin-film transistor substrate. The method includes following steps. First, a photo-mask is provided. The photo-mask has a first exposure area, a second exposure area and a third exposure area. The second exposure area is located in the first exposure area and the third exposure area. The photo-mask includes a first peripheral line pattern, a first dummy line pattern, a first overlapping pixel pattern and a second overlapping pixel pattern. The first peripheral line pattern is located in the first exposure area. The first dummy line pattern is located in the first exposure area and connected to the first peripheral line pattern. The first overlapping pixel pattern is located in the first exposure area and connected to the first dummy line pattern. The first overlapping pixel pattern and the second overlapping pixel pattern are complementary. A photoresist layer is formed on the substrate. The photoresist layer is exposed through the first peripheral line pattern, the first dummy line pattern and the first overlapping pixel pattern. The photoresist layer is exposed through the second overlapping pixel pattern. The photoresist layer is exposed through the second overlapping pixel pattern and the first overlapping pixel pattern at the same location. The photoresist layer is patterned. The substrate is etched by using the photoresist layer as an etch mask for forming several peripheral line patterns and several pixel patterns.

The invention will become apparent from the following detailed description of the preferred but non-limiting embodiments. The following description is made with reference to the accompanying drawings.

DETAILED DESCRIPTION OF THE INVENTION

Figure 1:
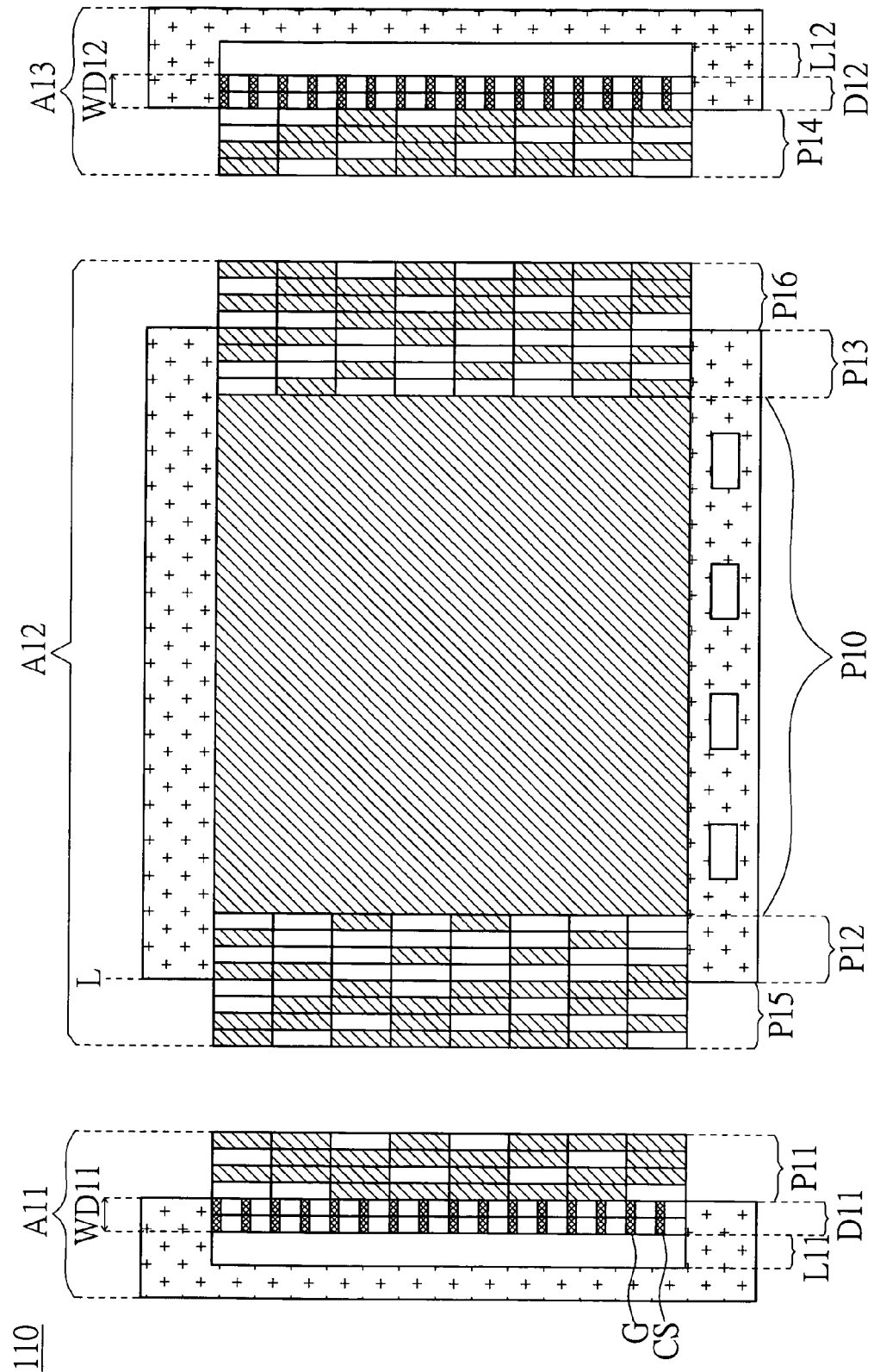
FIG. 1 illustrates a photo-mask according to a first embodiment of the present invention.
Figure 2:
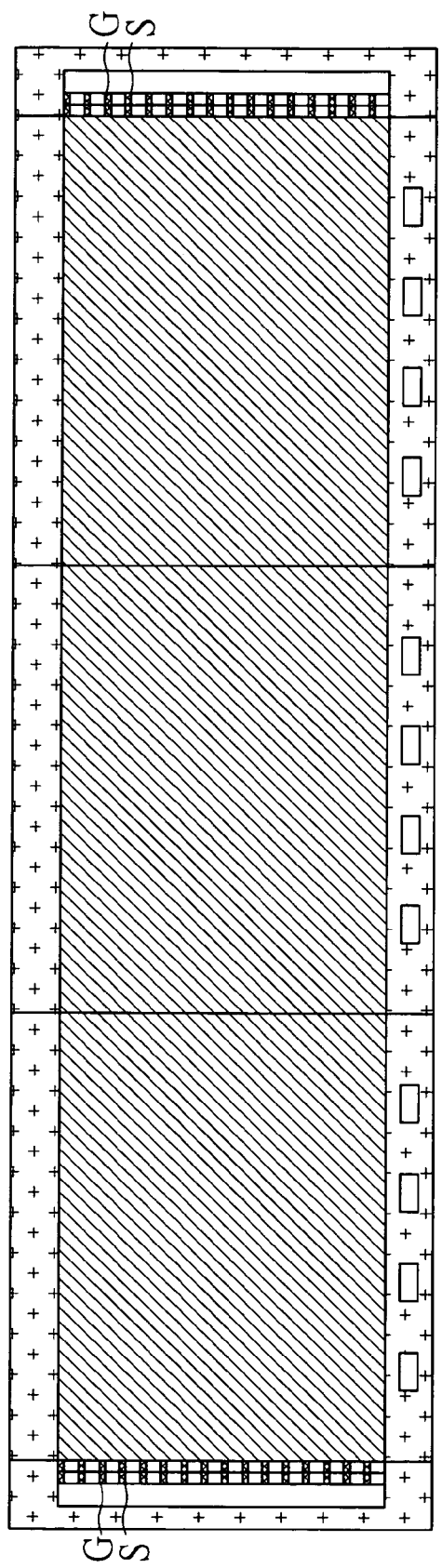
FIG. 2 illustrates a thin-film transistor substrate manufactured by using the photo-mask in FIG. 1.

Please refer to FIG. 1 and FIG. 2. FIG. 1 illustrates a photo-mask according to a first embodiment of the present invention. FIG. 2 illustrates a thin-film transistor substrate manufactured by using the photo-mask in FIG. 1. The photo-mask 110 is used for manufacturing the thin-film transistor substrate 130. The photo-mask 110 has a first exposure area A11, a second exposure area A12 and a third exposure area A13. The second exposure area A12 is located between the first exposure area A11 and the third exposure area A13. The photo-mask 110 includes a first peripheral line pattern L11, a second peripheral line pattern L12, a first dummy line pattern D11, a second dummy line pattern D12, a first overlapping pixel pattern P11, a second overlapping pixel pattern P12, a third overlapping pixel pattern P13, a fourth overlapping pixel pattern P14, a fifth overlapping pixel pattern P15, a sixth overlapping pixel pattern P16, and a central pixel pattern P10.

The first peripheral line pattern L11 and the second peripheral line pattern L12 are corresponding to the peripheral lines of the thin-film transistor substrate 130, such as gate lines G (scan lines), common electrode lines CS, or source lines (i.e. data lines, not shown in the drawings). Generally speaking, the gate lines G and the common electrode lines CS are located on two opposite sides of the thin-film transistor substrate 130. The source lines are located on the other two opposite sides of the thin-film transistor substrate 130. In the present embodiment, the first peripheral line pattern L11 is the pattern of the gate lines G and the common electrode lines CS on one side as an example. The first peripheral line pattern L11 is located in the first exposure area A11 of the photo-mask 110. The second peripheral line L12 is the pattern of the gate lines G and the common electrode lines CS on another side as an example. The second peripheral line pattern L12 is located in the third exposure area A13 of the photo-mask 110.

The first dummy line pattern D11 is located in the first exposure area A11 of the photo-mask 110 and connected to the first peripheral line pattern L11. The second dummy line pattern D12 is located in the third exposure area A13 of the photo-mask 110 and connected to the second peripheral line pattern L12. The first dummy line pattern D11 and the second dummy line pattern D12 are respectively the extension of the first peripheral line pattern L11 and the second peripheral line pattern L12. In other words, the first dummy line pattern D11 and the second dummy line pattern D12 also include the pattern of the gate lines G and the common electrode lines CS.

The first overlapping pattern P11 is located in the first exposure area A11 of the photo-mask 110 and connected to the first dummy line pattern D11. The fourth overlapping pixel pattern P14 is located in the third exposure area A13 of the photo-mask 110 and connected to the second dummy line pattern D12. In other words, the first peripheral line pattern L11, the first dummy line pattern D11, and the first overlapping pixel pattern P11 are located in the first exposure area A11 and are sequentially connected. The second peripheral line pattern L12, the second dummy line pattern D12, and the fourth overlapping pixel pattern P14 are located in the third exposure area A13 and are sequentially connected.

The second overlapping pixel pattern P12 and the fifth overlapping pixel pattern P15 are located on a side of the second exposure area A12 of the photo-mask 110. The fifth overlapping pixel pattern P15 is located on an external side. The third overlapping pixel pattern P13 and the sixth overlapping pixel pattern P16 are located on another side of the second exposure area A12 of the photo-mask 110. The sixth overlapping pixel pattern P16 is located on another external side. The central pixel pattern P10 is located at the center of the second exposure area A12 of the photo-mask 110. In other words, the fifth overlapping pixel pattern P15, the second overlapping pixel pattern P12, the central pixel pattern P10, the third overlapping pixel pattern P13, and the sixth overlapping pixel pattern P16 are located in the second exposure area 12 and are sequentially connected.

The first overlapping pixel pattern P11 to the sixth overlapping pixel pattern P16 are corresponding to the pattern of the pixels of the thin-film transistor substrate 130. In the first overlapping pixel pattern P11 to the sixth overlapping pixel pattern P16, pixel patterns are only formed in the shaded area but not in the blank area, which makes the patterns like a mosaic.

For example, the first overlapping pixel pattern P11 and the second overlapping pixel pattern P12 are complementary. In other words, the shaded area of the first overlapping pixel pattern P11 is corresponding to the blank area of the second overlapping pixel pattern P12. The blank area of the first overlapping pixel pattern P11 is corresponding to the shaded area of the second overlapping pixel pattern P12. After exposing through and overlapping the first overlapping pixel area P11 and the second overlapping pixel pattern P12, the patterns formed from exposing through the shaded area and the blank area are unified. As a result, the patterns which are formed from exposing through the first overlapping pixel pattern P11 and the second overlapping pixel pattern P12 are unified to form a complete pixel pattern.

The sixth overlapping pixel pattern P16 and the second overlapping pixel pattern P12 are complementary. Similarly, after exposing through and overlapping the sixth overlapping pixel pattern P16 and the second overlapping pixel pattern P12, the patterns formed from exposing through the shaded area and the blank areas are unified. As a result, the patterns which are formed from exposing through the sixth overlapping pixel pattern P16 and the second overlapping pixel pattern P12 are unified to form a complete pixel pattern.

Furthermore, the fourth overlapping pixel pattern P14 and the third overlapping pixel pattern P13 are complementary. Similarly, after exposing through and overlapping the fourth overlapping pixel pattern P14 and the third overlapping pixel pattern P13, the patterns formed from exposing through the shaded area and the blank area are unified. As a result, the patterns which are formed from exposing through the fourth overlapping pixel pattern P14 and the third overlapping pixel pattern P13 are unified to form a complete pixel pattern.

The fifth overlapping pixel pattern P15 and the third overlapping pixel pattern P13 are complementary. Similarly, after exposing through and overlapping the fifth overlapping pixel pattern P15 and the third overlapping pixel pattern P13, the patterns formed from exposing through the shaded area and the blank area are unified. As a result, the patterns which are formed from exposing through the fifth overlapping pixel pattern P15 and the third overlapping pixel pattern P13 are unified to form a complete pixel pattern.

Figure 3A:
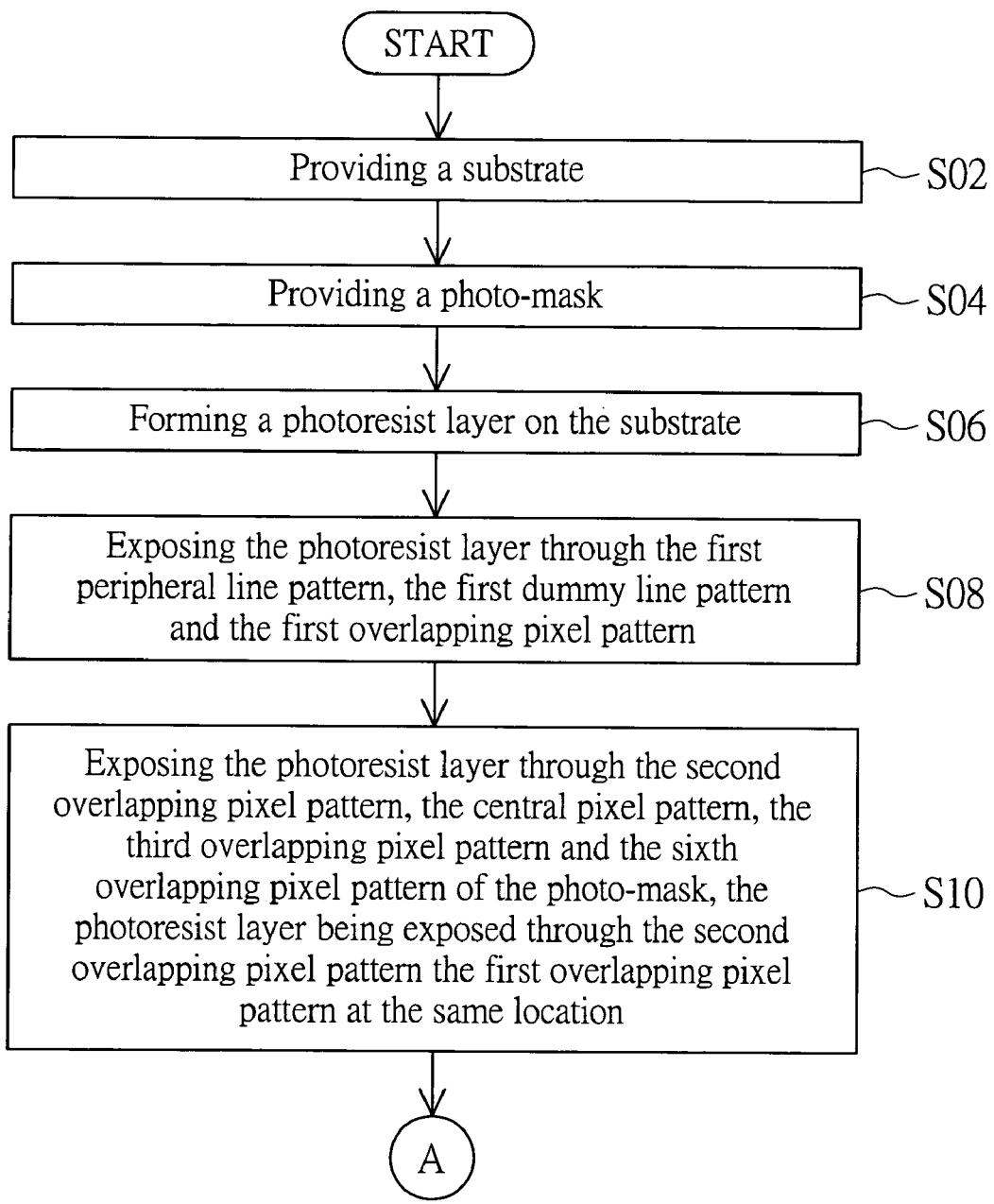
FIGS. 3A~3B are flow charts of the method of manufacturing the thin-film transistor substrate according to the first embodiment of the present invention.
Figure 3B:
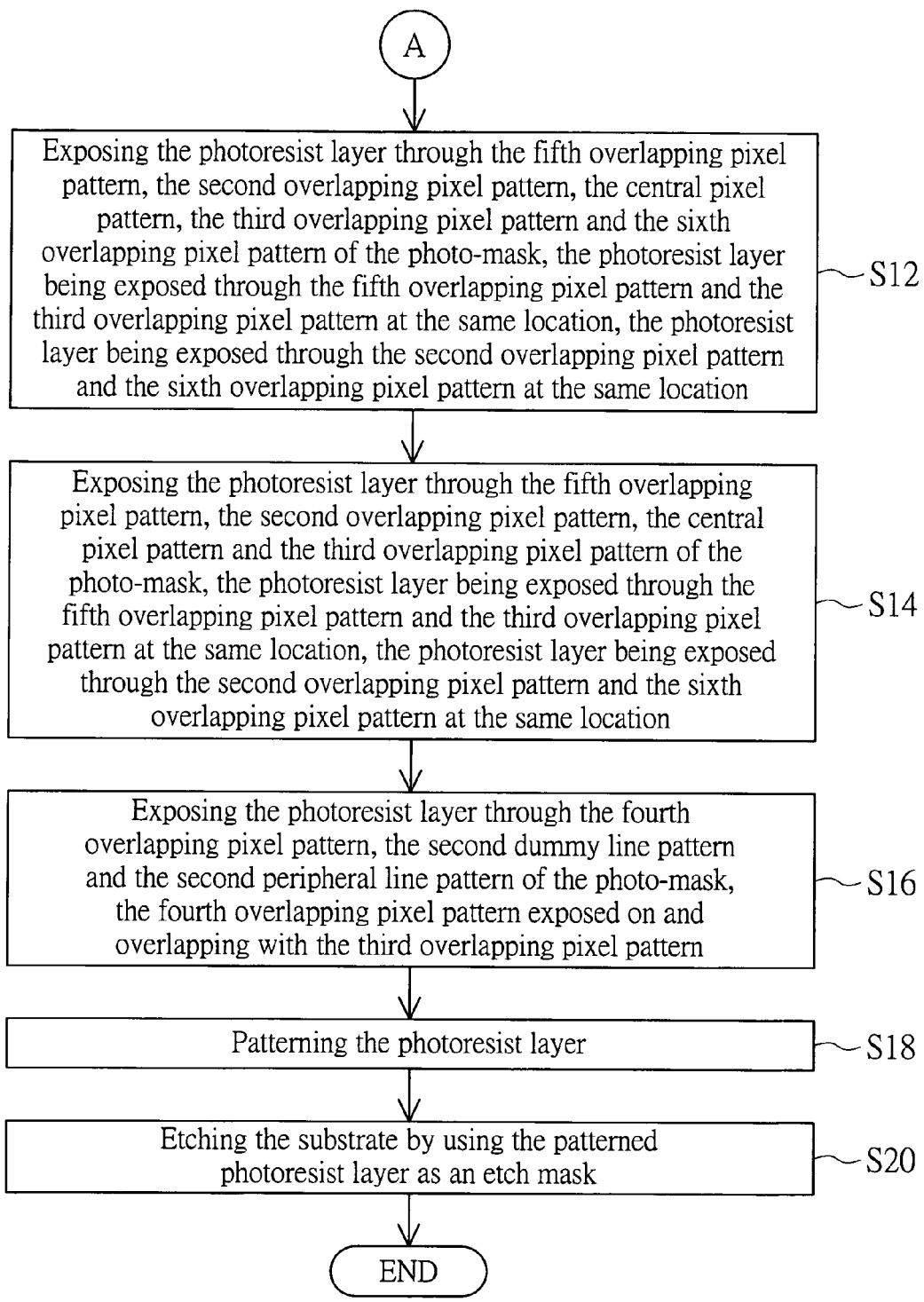

A flow chart is used for illustrating the method of manufacturing the thin-film transistor substrate 130 through multi-exposure by the photo-mask 110. Please refer to FIGS. 3A~3B and FIGS. 4A~4H. FIGS. 3A~3B are flow charts of the method of manufacturing the thin-film transistor substrate according to the first embodiment of the present invention. FIGS. 4A~4H illustrates steps in FIGS. 3A~3B.

Figure 4A:
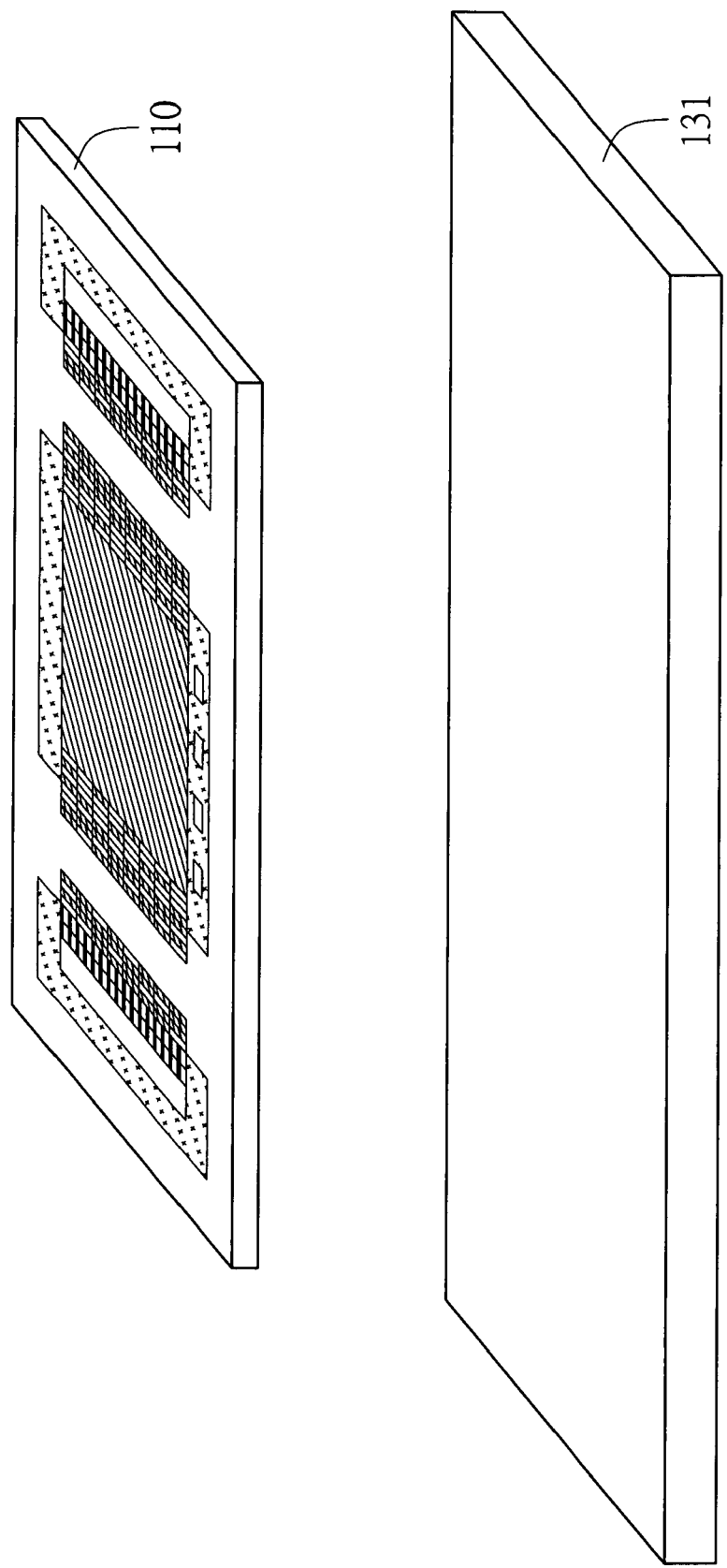
FIGS. 4A~4H illustrates steps in FIGS. 3A~3B.

Please refer to FIG. 4A. In step S02, a substrate 131 is provided. The substrate 131 is, for example, a glass substrate.

Next, please refer to FIG. 4A, a photo-mask 110 is provided in step S04.

Figure 4B:
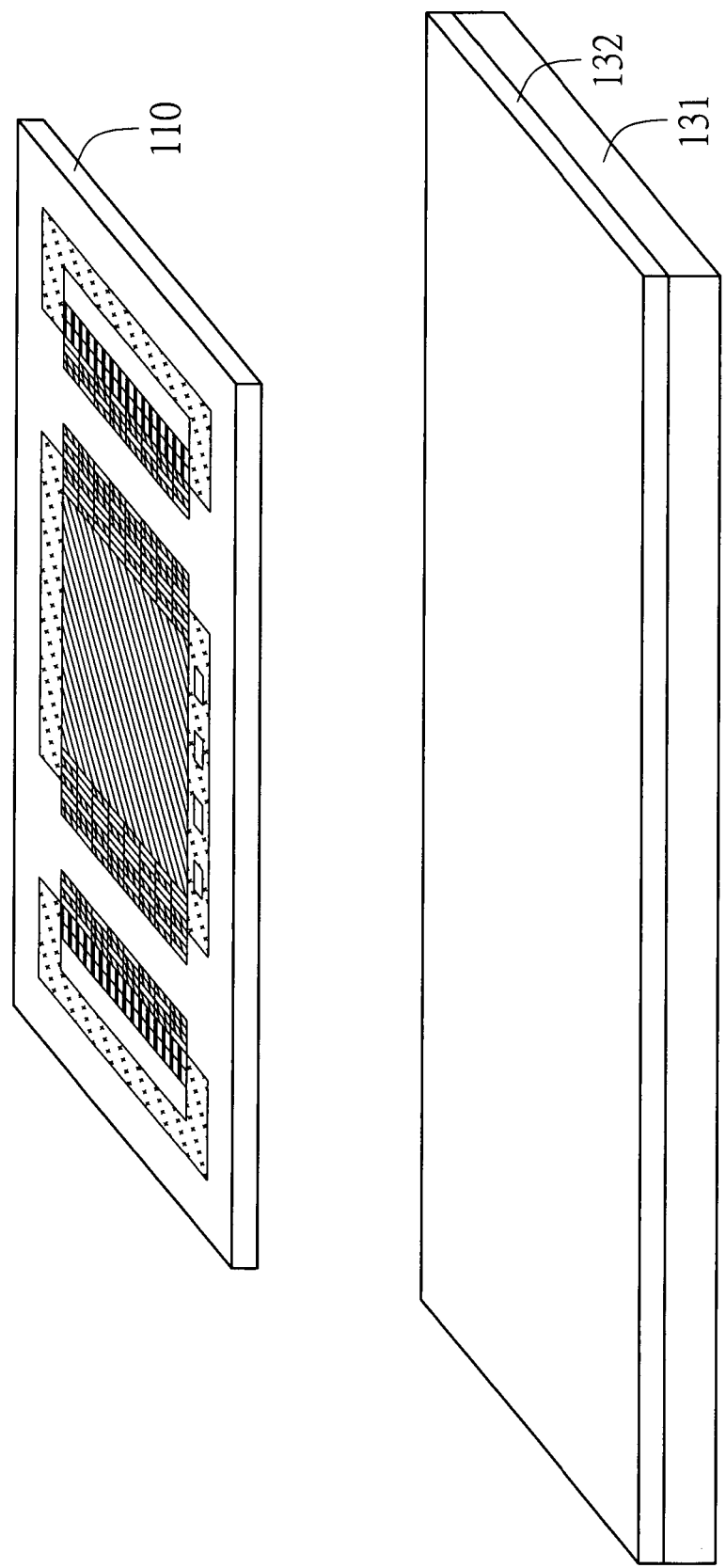

Then, please refer to FIG. 4B, a photoresist layer 132 is formed on the substrate 131 in step S06.

Figure 4C:
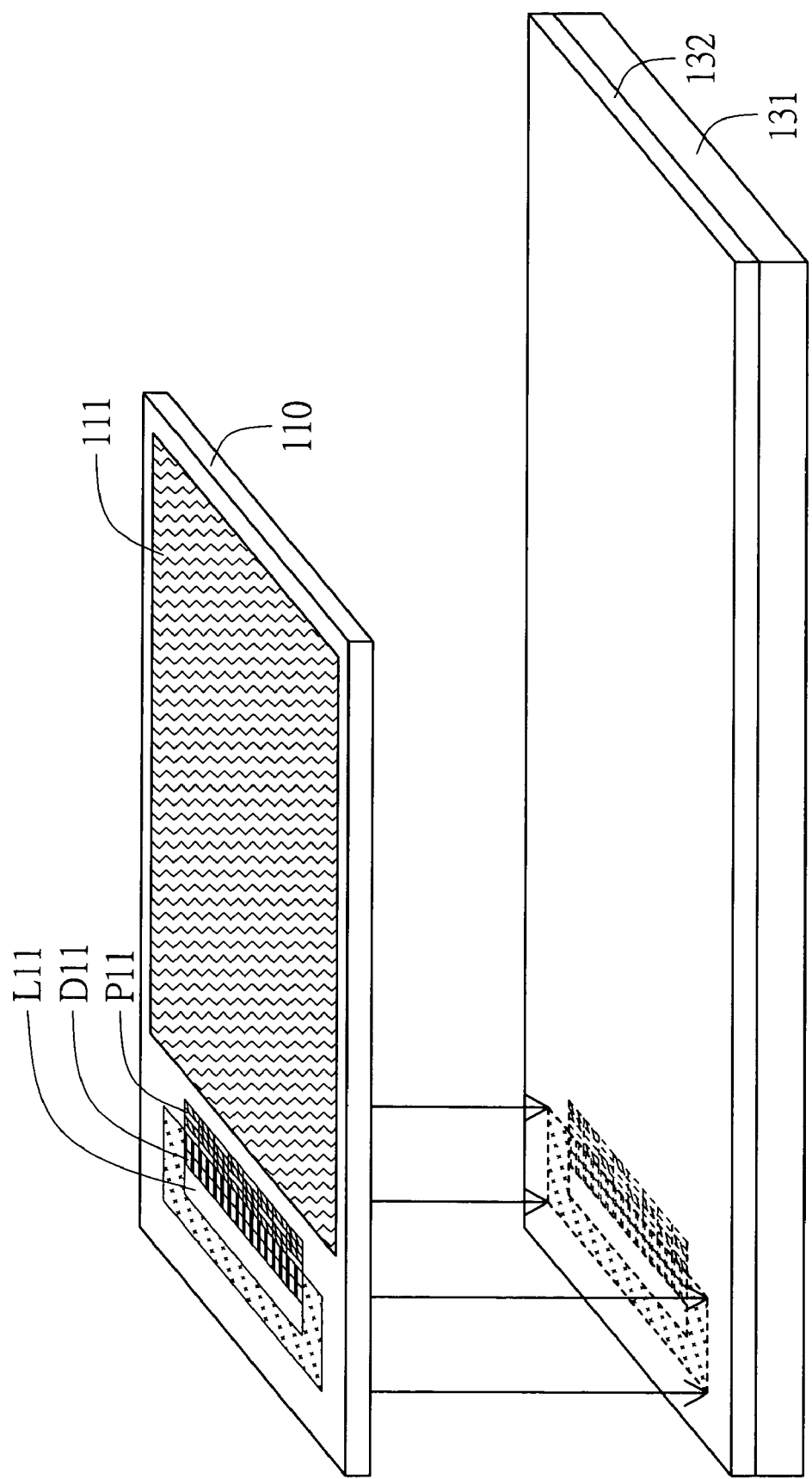

Afterward, please refer to FIG. 4C, at least a gobo board 111 is used for covering part of the photo-mask 110. As a result, only the first peripheral line pattern L11, the first dummy line pattern D11, and the first overlapping pixel pattern P11 of the photo-mask 110 are exposed to the surroundings. Meanwhile, the photoresist layer 132 is exposed through the first peripheral line pattern L11, the first dummy line pattern D11, and the first overlapping pixel pattern P11. At this moment, only the exposure process but not lithography process is performed on the photoresist layer 132. Dotted lines represent the patterns that have been transformed to the photoresist layer 132 but have not been developed yet.

Figure 4D:
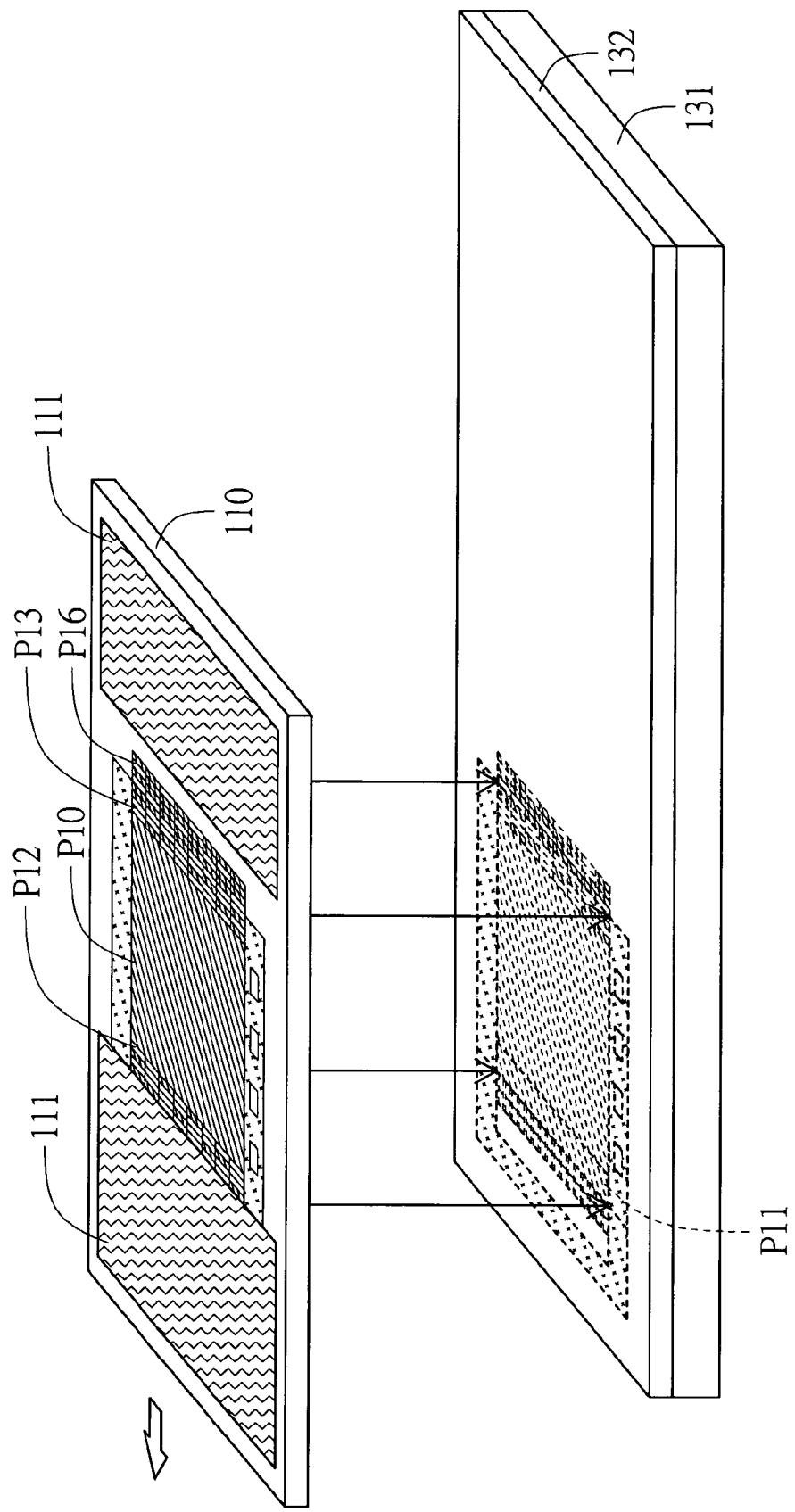

Please refer to FIG. 4D, the photo-mask 110 is moved in a step S10 so that the second overlapping pixel pattern P12 is corresponding to a pattern formed from exposing through the first overlapping pixel pattern P11 on the substrate 131. Also, the gobo board 111 covers part of the photo-mask 110 so that only the second overlapping pixel pattern P12, the central pixel pattern P10, the third overlapping pixel pattern P13, and the sixth overlapping pixel pattern P16 of the photo-mask 110 are exposed to the surroundings.

Meanwhile, the photoresist layer 132 is exposed through the second overlapping pixel pattern P12, the central pixel pattern P10, the third overlapping pixel pattern P13 and the sixth overlapping pixel pattern P16 of the photo-mask 110. The photoresist layer 132 is exposed through the second overlapping pixel pattern P12 and the first overlapping pixel pattern P11 at the same location. Therefore, the patterns formed from exposing through the second overlapping pixel pattern P12 and the first overlapping pixel pattern P11 are overlapping. The patterns formed from exposing through the first exposure area A11 of the photo-mask 110 and the second exposure area A12 of the photo-mask 110 are unified by overlapping the second overlapping pixel pattern P12 and the first overlapping pixel pattern P11.

Figure 4E:
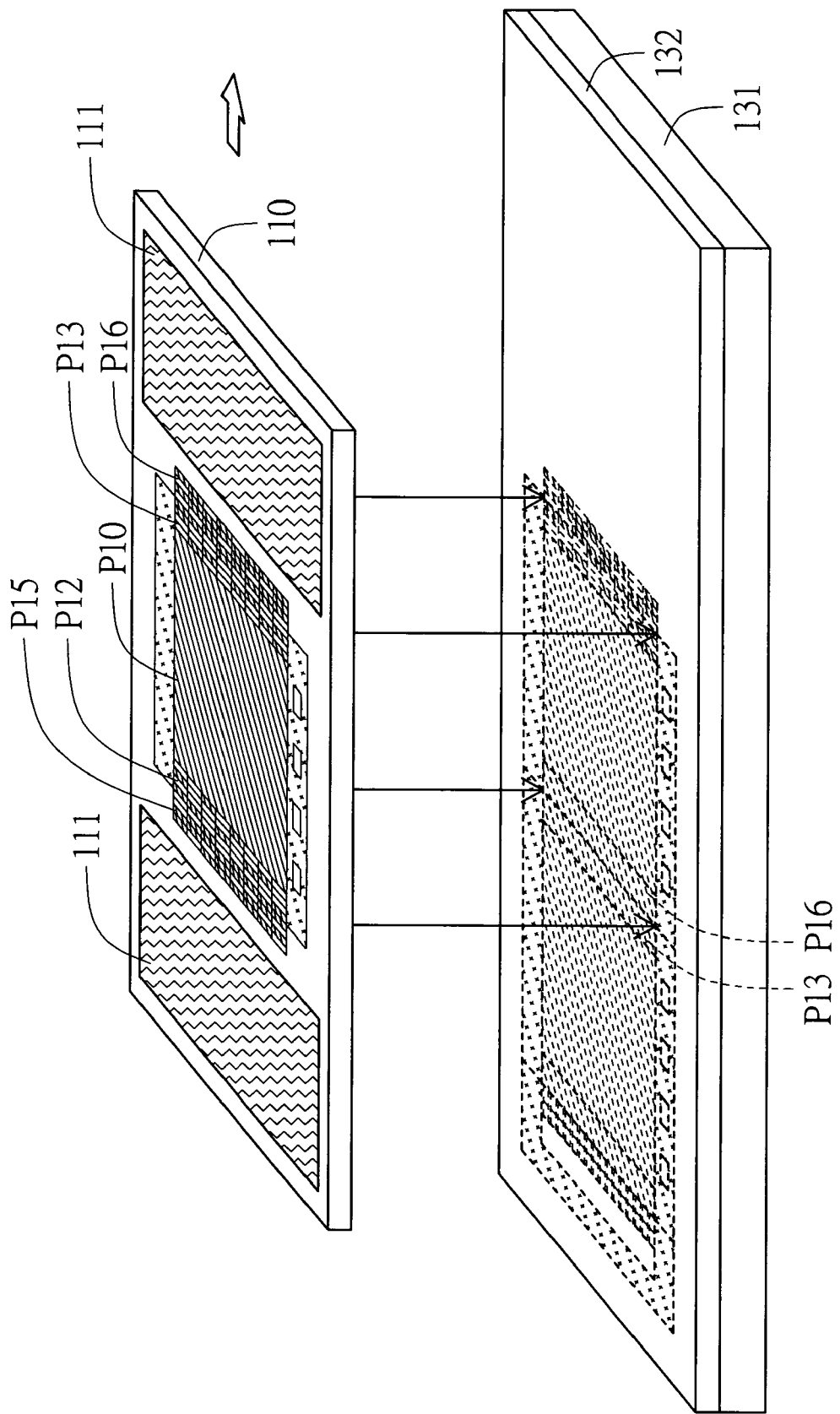

Then, please refer to FIG. 4E, the photo-mask 110 is moved in step S12 so that the fifth overlapping pixel pattern P15 and the second overlapping pixel pattern P12 of the photo-mask 110 are corresponding to the pattern formed from exposing through the third overlapping pixel pattern P13 and the sixth overlapping pixel pattern P16 on the substrate 131. Also, the gobo board 111 covers part of the photo-mask 110 so that only the fifth overlapping pixel pattern P15, the second overlapping pixel pattern P12, the central pixel pattern P10, the third overlapping pixel pattern P13 and the sixth overlapping pixel pattern P16 of the photo-mask 110 are exposed to the surroundings.

Meanwhile, the photoresist layer 132 is exposed through the fifth overlapping pixel pattern P15, the second overlapping pixel pattern P12, the central pixel pattern P10, the third overlapping pixel pattern P13, and the sixth overlapping pixel pattern P16 of the photo-mask 110. The photoresist layer 132 is exposed through the fifth overlapping pixel pattern P15 and the third overlapping pixel pattern P13 at the same location. The photoresist layer 132 is exposed through the second overlapping pixel pattern P12 and the sixth overlapping pixel pattern P16 at the same location. Therefore, the patterns formed from exposing through the fifth overlapping pixel pattern P15 and the third overlapping pixel pattern P13 are overlapping. The patterns formed from exposing through the second overlapping pixel pattern P12 and the sixth overlapping pixel pattern P16 are overlapping.

Figure 4F:
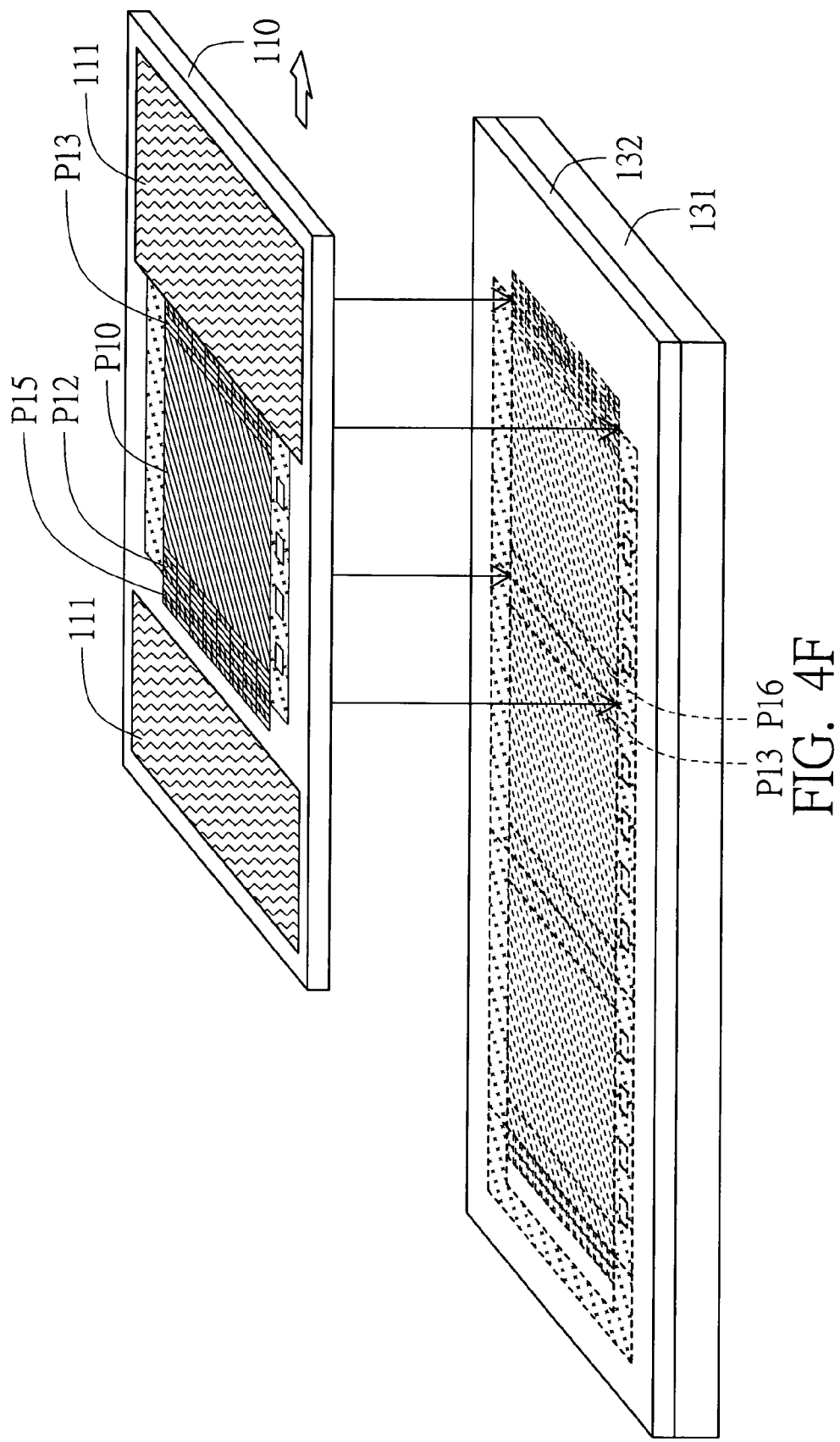

Subsequently, please refer to FIG. 4F, the photo-mask 110 is moved in step S14 so that the fifth overlapping pixel pattern P15 and the second overlapping pixel pattern P12 of the photo-mask 110 are corresponding to the patterns formed from exposing through the third overlapping pixel pattern P13 and the sixth overlapping pixel pattern P16 on the right-hand side of the substrate 131. Also, the gobo board 111 covers part of the photo-mask 110, so that only the fifth overlapping pixel pattern, the second overlapping pixel pattern P12, the central pixel pattern P10 and the third overlapping pixel pattern P13 of the photo-mask 110 are exposed to the surroundings.

Meanwhile, the photoresist layer 132 is exposed through the fifth overlapping pixel pattern P15, the second overlapping pixel pattern P12, the central pixel pattern P10, and the third overlapping pixel pattern P13 of the photo-mask 110. The photoresist layer 132 is exposed through the fifth overlapping pixel pattern P15 and the third overlapping pixel pattern P13 at the same location. The photoresist layer 132 is exposed through the second overlapping pixel pattern P12 and the sixth overlapping pixel pattern P16 at the same location. Therefore, the patterns formed from exposing through the fifth overlapping pixel pattern P15 and the third overlapping pixel pattern P13 are overlapping. The patterns formed from exposing through the second overlapping pixel pattern P12 and the sixth overlapping pixel pattern P16 are overlapping.

Figure 4G:
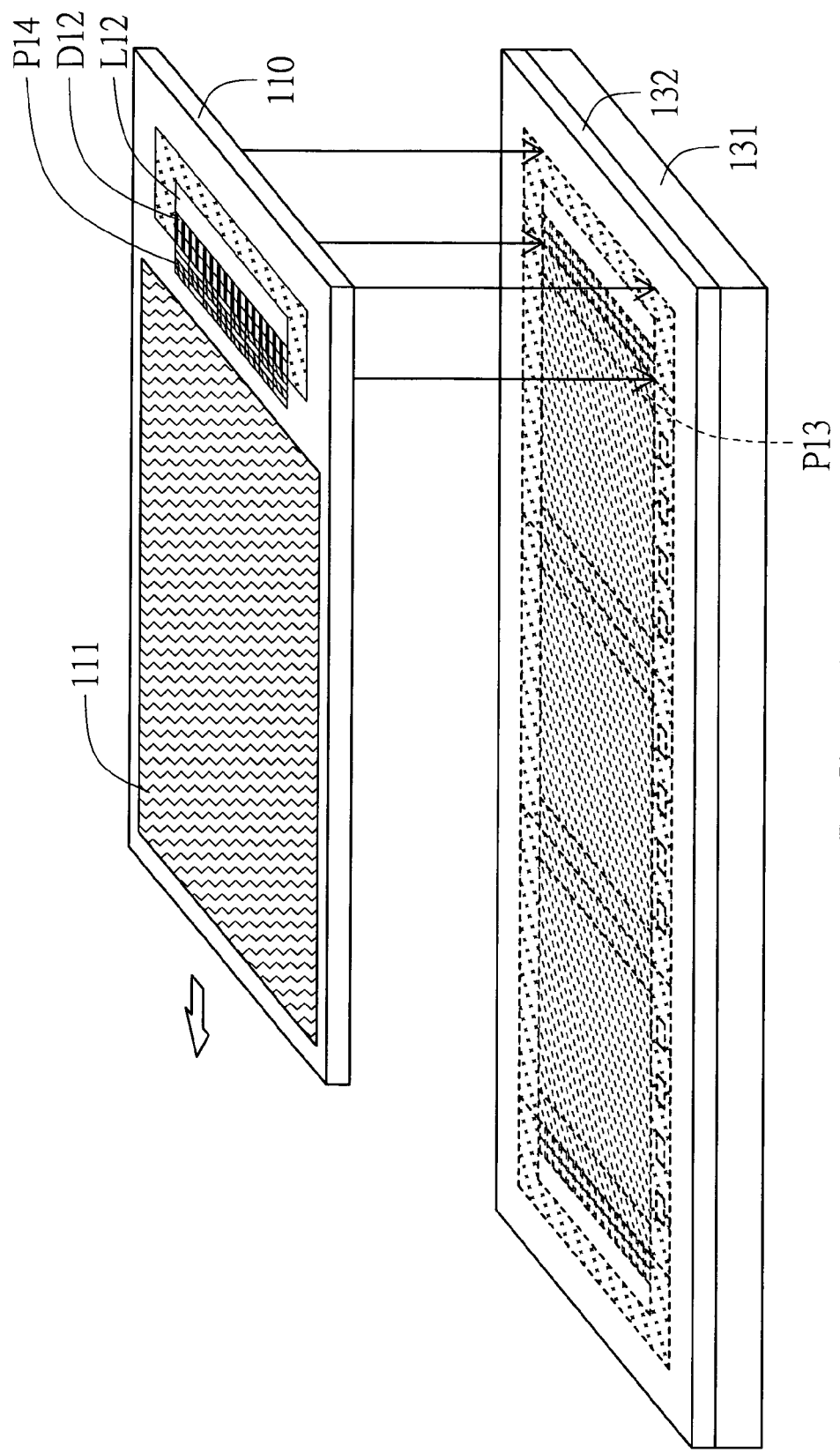

Thereon, please refer to FIG. 4G, the photo-mask 110 is moved in step S16, so that the fourth overlapping pixel pattern P14 of the photo-mask 110 is corresponding to a pattern formed from exposing through the third overlapping pixel pattern P13 on the right-hand side of the substrate 131. Also, the gobo board 111 covers part of the photo-mask 110, so that the fourth overlapping pixel pattern P14, the second dummy line pattern D12 and the second peripheral line pattern L12 of the photo-mask 110 are exposed to the surroundings.

Meanwhile, the photoresist layer 132 is exposed through the fourth overlapping pixel pattern P14, the second dummy line pattern D12 and the second peripheral line pattern L12 of the photo-mask 100. The photoresist layer 132 is exposed through the fourth overlapping pixel pattern P14 and the third overlapping pixel pattern P13 at the same location on the substrate 131. Therefore, the pattern formed from exposing through the fourth overlapping pixel pattern P14 and the third overlapping pixel pattern P13 are overlapping.

Later, please refer to FIG. 4H, the photoresist layer 132 is patterned by a developing agent in step S18.

Figure 4H:
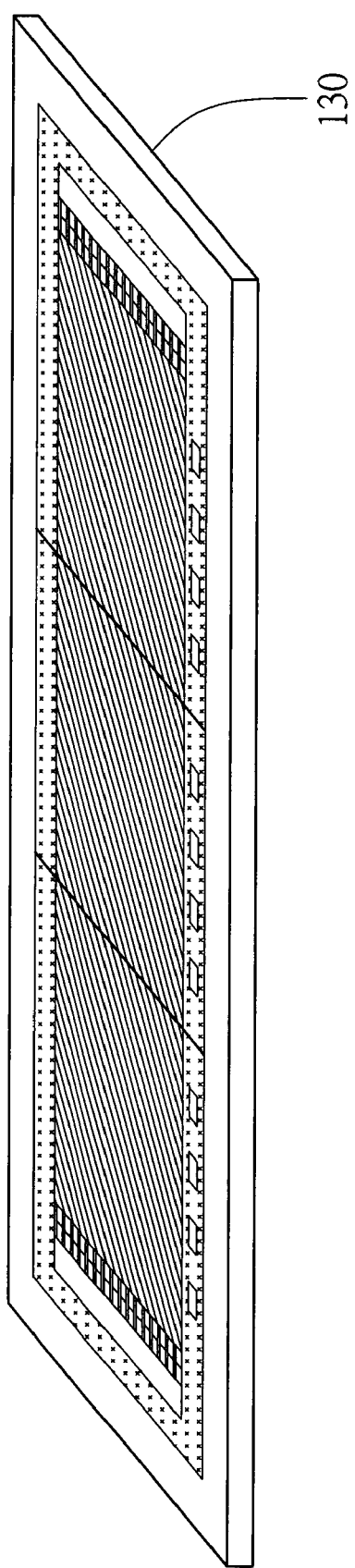

Afterward, please refer to FIG. 4H, the substrate 131 is etched by using the patterned photoresist layer 132 as an etch mask in step S20. Accordingly, one photo-mask patterning process of the thin-film transistor substrate 130 is completed.

Moreover, in above steps, the gobo board 111 is moved by a moving mechanism (not shown in drawings), and the exposure step is performed through a light beam. The moving mechanism comprises a stepper motor or a servo motor, for example. Also, the moving mechanism has certain precision and a minimum displacement increment. The displacement of the moving mechanism is not less than this minimum displacement increment. In other words, when the moving mechanism moves the gobo board 111 to a specific location, the moving mechanism can not move the gobo board 111 through a distance less than the minimum displacement increment. Therefore, the gobo board 111 may have mechanism alignment error less than the minimum displacement increment.

Furthermore, the light beam has a diffraction range. Therefore, the light beam may have optical alignment error less than the diffraction range.

In step S10, as shown in FIG. 4D and FIG. 1, the edge of the gobo board 111 (shown in FIG. 4D) is corresponding to the borderline L (shown in FIG. 1) of the fifth overlapping pixel pattern P15 and the second overlapping pixel pattern P12 of the photo-mask 110, for covering the fifth overlapping pixel pattern P15 and exposing the second overlapping pixel pattern P12. Because of the mechanism and optical alignment error of the gobo board 111, the fifth overlapping pixel pattern P15 near the borderline L may be exposed on and overlap with the first dummy line pattern D11 of the substrate 131. Because the first dummy line pattern D11 is located in a non-display area, the mechanism and optical alignment error of the gobo board 111 does not cause poor connection mark in the display area and therefore does not affect the luminance uniformity of the display area.

Besides, the pattern formed from exposing through the fifth overlapping pixel pattern P15 overlapping with the pattern formed form exposing through the first dummy line pattern D11 does not damage the pattern formed from exposing through the first dummy line pattern D11. Therefore, the patterns formed from exposing through the first peripheral line pattern L11 and the first dummy line pattern D11 still function well.

Preferably, as shown in FIG. 1, the width WD11 of the first dummy line pattern D11 only needs to be larger than the sum of the minimum displacement increment of the gobo board 111 and the diffraction range of the light beam. As a result, even under the effect of the mechanism and optical alignment error of the gobo board 111, part of the pattern formed from incautiously exposing through the fifth overlapping pixel pattern P15 overlaps with the pattern formed from exposing through the first dummy line pattern D11.

The first dummy line pattern D11 of the present embodiment adopts line pattern rather than dummy pixel pattern. Under the condition of the sum of the minimum displacement increment of the gobo board 111 and the diffraction range of the light beam, the width WD11 of the first dummy line pattern D11 only needs to between 1 mm and 5 mm to meet the requirement. Compared to the design of the dummy pixel pattern, the width WD11 of the first dummy line pattern D11 can be reduced greatly.

Similarly, in step S14, under the condition of the sum of the minimum displacement of the gobo board 111 and the diffraction range of the light beam, the width D12 of the second dummy line pattern D12 only needs to be between 1 mm and 5 mm to meet the requirement. Compared to the design of the dummy pixel pattern, the width WD12 of the second dummy line pattern can be reduced greatly.

Furthermore, in above double exposure steps, because the first overlapping pixel pattern P11 to the sixth overlapping pixel pattern P16 are mosaic pattern, there is no obvious connection mark on the thin-film transistor substrate 130.

Second Embodiment

Figure 5:
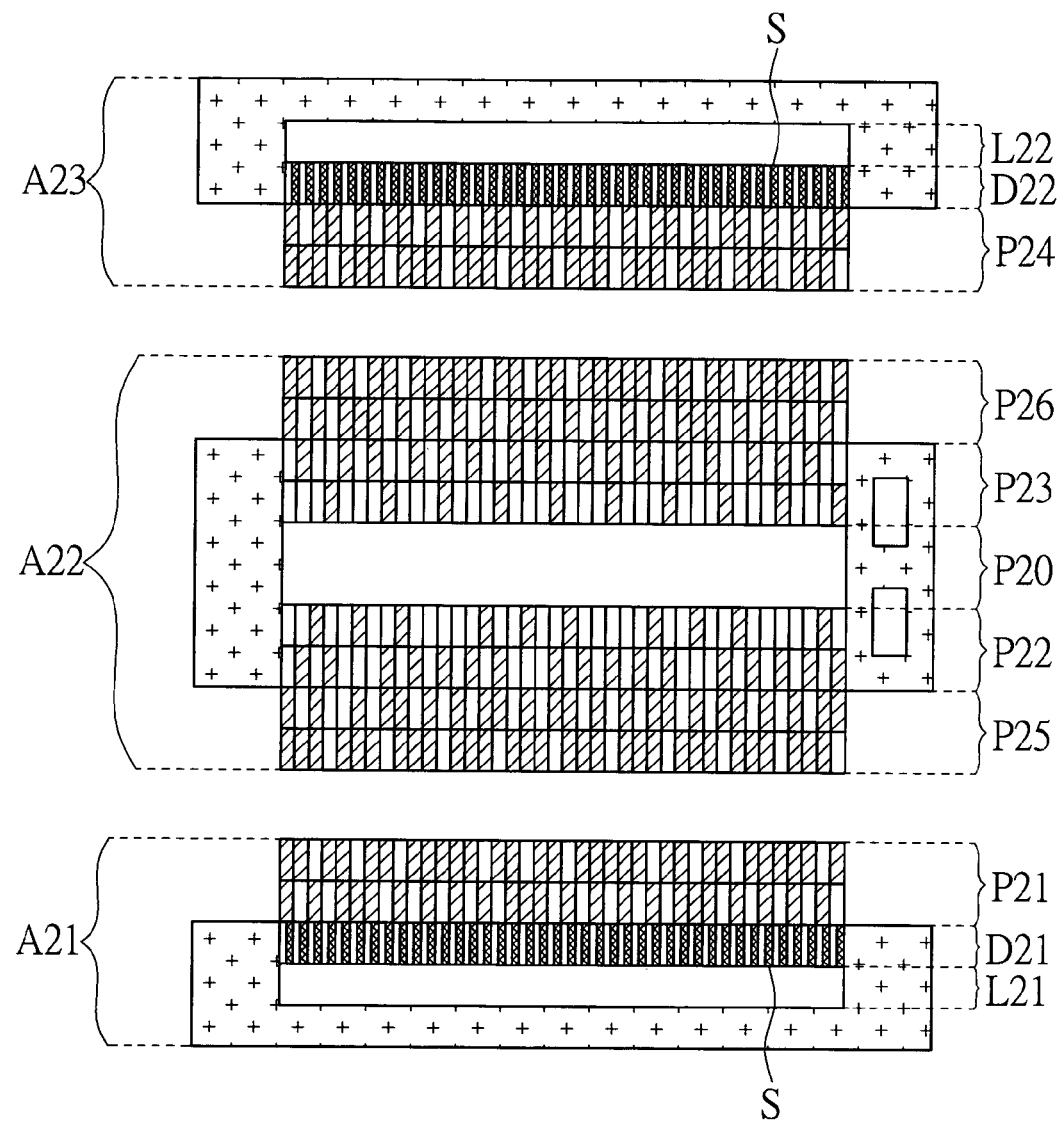
FIG. 5 illustrates the photo-mask according to a second embodiment of the present invention.

Please refer to FIG. 5 illustrating the photo-mask according to a second embodiment of the present invention. The difference between the first embodiment and the present embodiment is that the first dummy line pattern D21 is the pattern of the source lines (data lines) S on a side as an example. The second dummy line pattern D22 is the pattern of the source lines S on another side as an example.

The location of the first exposure area A21, the second exposure area A22, and the third exposure area A23 are arranged according to the first dummy line pattern D21 and the second dummy line pattern D22 along the extension direction of the source lines S. As shown in FIG. 5, the first peripheral line pattern L21, the first dummy line pattern D21 and the first overlapping pixel pattern P21 are located in the first exposure area A21 and are sequentially connected. The fifth overlapping pixel pattern P25, the second overlapping pixel pattern P22, the central pixel pattern P20, the third overlapping pixel pattern P23, and the sixth overlapping pixel pattern P26 are located in the second exposure area A22 and are sequentially connected. The fourth pixel pattern P24, the second dummy line pattern D22 and the second peripheral line pattern L22 are located in the third exposure area A23 and are sequentially connected.

The method of manufacturing the thin-film transistor substrate 130 of the present embodiment is similar to that of the first embodiment and therefore not described repeatedly.

Although three central pixel patterns are unified in the method of manufacturing the thin-film transistor substrate of the above embodiments, the number of the unified central pixel patterns is not limited thereto. Two central pixel patterns or more than three central pixel patterns can be unified to increase the size of the thin-film transistor substrate.

Moreover, the mosaic pattern of the first overlapping pixel to the sixth overlapping pixel is not limited to the above one. Designer can design the pattern according to the practical demand.

In the method of manufacturing the photo-mask and the thin-film transistor substrate of the above embodiments of the present invention, the dummy line pattern and the overlapping pixel pattern are used for unifying several exposed patterns after multi-exposure through the photo-mask. As a result, the unified patterns can form a thin-film transistor substrate of a specific size. This method includes many advantages, and only some of them are illustrated as follow.

First, the overlapping pixel patterns are unified through multi-exposure process for manufacturing a thin-film transistor substrate of a specific size. Therefore, the same photo-mask can be used for manufacturing thin-film transistor substrates of different sizes.

Second, the size of the thin-film transistor substrate can be increased without limitation to the size of the photo-mask.

Third, the dummy line pattern is located in the non-display area. Therefore, the mechanism and optical alignment error of the gobo board does not result in poor connection mark in the display area. As a result, the luminance uniformity of the display area is not affected.

Fourth, the pattern formed from incautiously exposing through the overlapping pixel pattern does not damage the pattern formed form exposing through the dummy line pattern. Therefore, the pattern formed from exposing through the peripheral line pattern and the dummy line pattern can still function well.

Fifth, the width of the dummy line pattern only needs to be larger than the sum of the minimum displacement increment of the gobo board and the diffraction range of the light beam. As a result, part of the pattern formed from incautiously exposing through the overlapping pixel pattern overlays the pattern formed from exposing through the dummy line pattern.

Sixth, the dummy line pattern is line pattern but not dummy pixel pattern. Under the condition of the sum of the minimum displacement of the gobo board and the diffraction range of the light beam, the width of the dummy line pattern only needs to be between 1 mm and 5 mm to meet the requirement. Compared to the design of the dummy pixel pattern, the width of the dummy line pattern is reduced greatly.

Seventh, because the width of the dummy line pattern is reduced, the space of the line is increased, and the entire impedance of the thin-film transistor substrate is reduced.

Eighth, only the dummy line pattern and the overlapping pixel pattern for connection are located in the first exposure area. Therefore, the size of the central pixel pattern in the second exposure area is increased. In the manufacturing process of the thin-film transistor substrate, the large-size central pixel pattern can be unified at a time, which reduces the steps of the manufacturing process and further increases the yield rate.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photo-mask for manufacturing a thin-film transistor substrate, the photo-mask comprising a first exposure area, a second exposure area and a third exposure area, the second exposure area located between the first exposure area and the third exposure area, the photo-mask comprising:

a first peripheral line pattern located in the first exposure area;

a first dummy line pattern located in the first exposure area and connected to the first peripheral line pattern;

a first overlapping pixel pattern located in the first exposure area and connected to the first dummy line pattern; and a second overlapping pixel pattern located in the second exposure area, the first overlapping pixel pattern being complementary to the second overlapping pixel pattern, wherein two patterns respectively formed from exposing through the first exposure area and the second exposure area are unified after exposing through and overlapping the first overlapping pixel pattern and the second pixel pattern are exposed.

2. The photo-mask according to claim 1 further comprising:
a third overlapping pixel pattern located in the second exposure area;
a second peripheral line pattern located in the third exposure area;
a second dummy line pattern located in the third exposure area and connected to the second peripheral line pattern; and
a fourth overlapping pixel pattern located in the third exposure area and connected to the second dummy line pattern, the fourth overlapping pixel pattern and the third overlapping pixel pattern being complementary, wherein two patterns respectively formed from exposing through the second exposure area and the third exposure area are unified after exposing through and overlapping the fourth overlapping pixel pattern and the third overlapping pixel pattern.

3. The photo-mask according to claim 2 further comprising:
a fifth overlapping pixel pattern located in the second exposure area and connected to an external side of the second overlapping pixel pattern and complementary to the third overlapping pixel pattern; and
a sixth overlapping pixel pattern located in the second exposure area and adjacent to an external side of the third overlapping pixel pattern and complementary to the second overlapping pixel pattern, wherein two patterns formed from exposing twice through the second exposure area are unified after exposing through and overlapping the fifth overlapping pixel pattern and the third overlapping pixel pattern, as well as exposing through and overlapping the sixth overlapping pixel pattern and the second overlapping pixel.

4. The photo-mask according to claim 1, wherein a gobo board is used for covering part of the photo-mask, a light beam is used for exposing, and the width of the first dummy line pattern is larger than or equal to the sum of the minimum displacement increment of the gobo board and the diffraction range of the light beam.

5. The photo-mask according to claim 1, wherein the width of the first dummy line pattern is less than or equal to the width of the first overlapping pixel pattern or the second overlapping pixel pattern.

6. The photo-mask according to claim 1, wherein the width of the first dummy line pattern is between 1 mm and 5 mm.

7. The photo-mask according to claim 2, wherein the first dummy line pattern comprises a data line pattern.

8. The photo-mask according to claim 1, wherein the first dummy line pattern comprises a scan line pattern.

9. A method of manufacturing a thin-film transistor substrate, the method comprising:
providing a substrate;
providing a photo-mask comprising a first exposure area, a second exposure area and a third exposure area, the second exposure area located between the first exposure area and the third exposure area, the photo-mask comprising a first peripheral line pattern, a first dummy line pattern, a first overlapping pixel pattern and a second overlapping pixel pattern, the first peripheral line pattern located in the first exposure area, the first dummy line pattern located in the first exposure area and connected to the first peripheral line pattern, the first overlapping pixel pattern located in the first exposure area and connected to the first dummy line pattern, the first overlapping pixel pattern being complementary to the second overlapping pixel pattern;
forming a photoresist layer on the substrate;
exposing the photoresist layer through the first peripheral line pattern, the first dummy line pattern and the first overlapping pixel pattern;
exposing the photoresist layer through the second overlapping pixel pattern, wherein the photoresist layer is exposed through the second overlapping pixel pattern and the first overlapping pixel pattern at the same location;
patterning the photoresist layer; and
etching the substrate by using the photoresist layer as an etch mask for forming a plurality of peripheral line patterns and pixel patterns.

10. The method according to claim 9, wherein the photo-mask further comprises a third overlapping pixel pattern, a second peripheral line pattern, a second dummy line pattern and a fourth overlapping pixel pattern, the third overlapping pixel pattern located in the second exposure area, the second peripheral line pattern located in the third exposure area, the second dummy line pattern located in the third exposure area and connected to the second peripheral line pattern, the fourth overlapping pixel pattern located in the third exposure area and connected to the second dummy line pattern, the fourth overlapping pixel pattern and the third overlapping pixel pattern being complementary, the method of manufacturing the thin-film transistor substrate further comprising:
exposing the photoresist layer through the third overlapping pixel pattern; and
exposing the photoresist layer through the second peripheral line pattern, the fourth overlapping pixel pattern and the second dummy line pattern, wherein the photoresist layer is exposed through the fourth overlapping pixel pattern and the third overlapping pixel pattern at the same location.

11. The method according to claim 9, wherein the photo-mask further comprises a fifth overlapping pixel pattern and a sixth overlapping pixel pattern, the fifth overlapping pixel pattern located in the second exposure area and connected to an external side of the second overlapping pixel pattern, the fifth overlapping pixel pattern complementary to the third overlapping pixel pattern, the sixth overlapping pixel pattern located in the second exposure area and connected to an external side of the third overlapping pixel pattern and complementary to the second overlapping pixel pattern, the method further comprising:
exposing the photoresist layer through the third overlapping pixel pattern and the sixth overlapping pixel pattern;
exposing the photoresist layer through the fifth overlapping pixel pattern and the second overlapping pixel pattern, wherein the photoresist layer is exposed through the fifth overlapping pixel pattern and the third overlapping pixel pattern at the same location, and the photoresist layer is exposed through the second overlapping pixel pattern and the sixth overlapping pixel pattern at the same location.

12. The method according to claim 9 further comprising:
using at least a gobo board to cover part of the photo-mask not to be exposed.

* * * * *